United States Patent
Confalonieri et al.

(10) Patent No.: US 6,788,586 B2
(45) Date of Patent: Sep. 7, 2004

(54) OUTPUT BUFFER FOR A NONVOLATILE MEMORY WITH OUTPUT SIGNAL SWITCHING NOISE REDUCTION, AND NONVOLATILE MEMORY COMPRISING THE SAME

(75) Inventors: Emanuele Confalonieri, Milan (IT); Antonino Geraci, Lercara Friddi (IT); Marco Sforzin, Cantu' (IT); Lorenzo Bedarida, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/161,053

(22) Filed: May 30, 2002

(65) Prior Publication Data
US 2003/0048670 A1 Mar. 13, 2003

(30) Foreign Application Priority Data
Jun. 1, 2001  (IT) ..................................... TO2001A0530

(51) Int. Cl.$^7$ ................................................ G11C 7/00
(52) U.S. Cl. ...................... 365/189.05; 326/26; 326/82; 327/108; 327/379
(58) Field of Search ........................... 365/189.05, 191; 326/26, 27, 82, 83, 23, 24, 87; 327/108, 379, 112, 384

(56) References Cited

U.S. PATENT DOCUMENTS

| | | | |
|---|---|---|---|
| 5,015,889 A | * | 5/1991 | Reay ............................. 326/90 |
| 5,149,991 A | * | 9/1992 | Rogers ......................... 326/27 |
| 5,365,123 A | * | 11/1994 | Nakase et al. ............... 326/109 |
| 5,929,669 A | | 7/1999 | Kim ............................. 327/112 |
| 6,225,838 B1 | * | 5/2001 | Lee .............................. 327/108 |

* cited by examiner

*Primary Examiner*—Son Mai
(74) *Attorney, Agent, or Firm*—Lisa K. Jorgenson; Harold H. Bennett II; Seed IP Law Group PLLC

(57) ABSTRACT

Described herein is an output buffer including an output stage formed by a pull-up transistor and a pull-down transistor, which are connected in series between a supply line set at a supply potential and a ground line set at a ground potential, with an intermediate node connected to the output of the output buffer. The output buffer further includes a unidirectional decoupling stage arranged between the output of the output buffer and the pull-up transistor for decoupling the output from the supply line during the switching transients of the output buffer in such a way as to prevent the switching noise present on the latter from being transferred onto the output of the output buffer.

22 Claims, 4 Drawing Sheets

OUTPUT BUFFER FOR A NONVOLATILE MEMORY WITH OUTPUT SIGNAL SWITCHING NOISE REDUCTION, AND NONVOLATILE MEMORY COMPRISING THE SAME

BACKGROUND OF THE INVENTION

1. Field of the Invention

The present invention relates to an output buffer for a nonvolatile memory with output signal switching noise reduction, and to a nonvolatile memory comprising the same.

2. Description of the Related Art

As is known, at present the semiconductor device market demands the manufacture of storage devices with increasingly higher operating frequencies, and this results in the need to have available output buffers with increasingly higher switching speeds.

These switching speeds are currently obtained by increasing the amplitude of the current supplied by the output buffers, and this increase in the output current is obtained by increasing the size of the output buffers.

However, the larger the sizes of the output buffers, the higher the currents that they absorb during the switching phase, and these currents consequently create sharp drops or dumps in the supply voltage of the storage devices, the dumps concurring in considerably reducing the setting time, and hence the reading time, of the storage devices.

In particular, the dumps in the supply voltage of the storage devices define the so-called "switching noise" of storage devices and are closely linked to parameters that are often not controllable, such as the inductive characteristics of the supply path, the number of output buffers that switch simultaneously, the value of the supply voltage of the storage devices, etc.

In order to reduce switching noise, numerous techniques for controlling the slew rate of output buffers have been proposed, most of which are essentially based upon the principle of limiting the time derivative of the current absorbed by the output buffers by reducing the charging and discharging speed of the gate terminals of the pull-up and pull-down transistors of the output stages of the output buffers during the turning-on of the latter.

In particular, slowing-down of charge and discharge of the gate terminals of the pull-up and pull-down transistors of the output stages of output buffers is currently obtained by acting on the logic inverters that control the pull-up and pull-down transistors in two different alternative ways: either using resistive transistors or by means of current control.

In detail, the former technique consists in rendering resistive the pull-down transistor of the logic inverter that controls the pull-up transistor of the output stage and the pull-up transistor of the logic inverter that controls the pull-down transistor of the output stage, whilst the latter technique consists in current-controlling the pull-down transistor of the logic inverter that controls the pull-up transistor of the output stage and the pull-up transistor of the logic inverter that controls the pull-down transistor of the output stage.

Although the above-mentioned techniques enable a reduction in the time derivative of the current absorbed by output buffers and an improvement in the immunity to the switching noise of output buffers, they present, however, a drawback that does not enable adequate exploitation of all their advantages.

In particular, the major undesired effect of these techniques is that of introducing a further switching delay of the output buffers in addition to the delay caused by the high capacitance typically connected to the outputs of the output buffers, this delay concurring in reducing the maximum switching speed, and hence the maximum switching frequency, of the output buffers.

BRIEF SUMMARY OF THE INVENTION

An embodiment of the present invention provides an output buffer for a memory device and a memory device that are free from the drawbacks described above.

According to an embodiment of the present invention an output buffer for a memory device is provided, including an output stage having a first transistor and a second transistor connected in series between a first line set at a first potential and a second line set at a second potential and having an intermediate node connected to an output of the output buffer. The output stage includes unidirectional decoupling means for decoupling the output of said output buffer from at least the first line or the second line during a switching transient of the output buffer, the decoupling means arranged in series with the first and second transistors between the first and second lines.

According to another embodiment of the present invention a memory device is also provided, including an output buffer as described above.

An embodiment of the invention provides a method, including inputting a first logic value to an input of an output buffer, inputting a second logic value, different from the first value, to the input, and, switching an output of the output buffer from the first logic value to the second logic value by decoupling the output from a first line at a first potential and coupling the output to a second line at a second potential, wherein a diode is connected between the output and the second line.

BRIEF DESCRIPTION OF THE SEVERAL VIEWS OF THE DRAWING(S)

For a better understanding of the present invention, two preferred embodiments thereof are now described, purely by way of non-limiting example, with reference to the attached drawings, in which.

DETAILED DESCRIPTION OF THE INVENTION

The present invention is based upon the principle of decoupling the output of the output buffer from the supply line during switching of the output buffer in such a way as to prevent the noise present on the supply line from being transferred onto the output of the output buffer, and such a decoupling is obtained by introducing an electronic component with characteristics of unidirectionality between the output of the output buffer and the supply line, arranged in series to the pull-up transistor.

In fact, the output buffer can be modelled as an RLC network in which the capacitance is represented by the capacitance of the load connected to the output of the output buffer, the inductance is represented by the inductance of the supply path of the output buffer, and the resistance is represented by the resistance of the transistors of the output stage of the output buffer, and during switching of the output buffer the RLC network oscillates, transferring the oscillations also onto the output of the output buffer.

Insertion of an electronic component with characteristics of unidirectionality within the RLC network instead prevents these oscillations from being transferred onto the output of the output buffer.

A similar decoupling can moreover be obtained with respect to the ground line by introducing a similar electronic component having characteristics of unidirectionality between the output of the output buffer and the ground line, arranged in series to the pull-down transistor.

In order to prevent a limitation of the output dynamics of the output buffer, the electronic component with characteristics of unidirectionality can then be short-circuited at the end of the switching transient of the output buffer.

Figure 1:
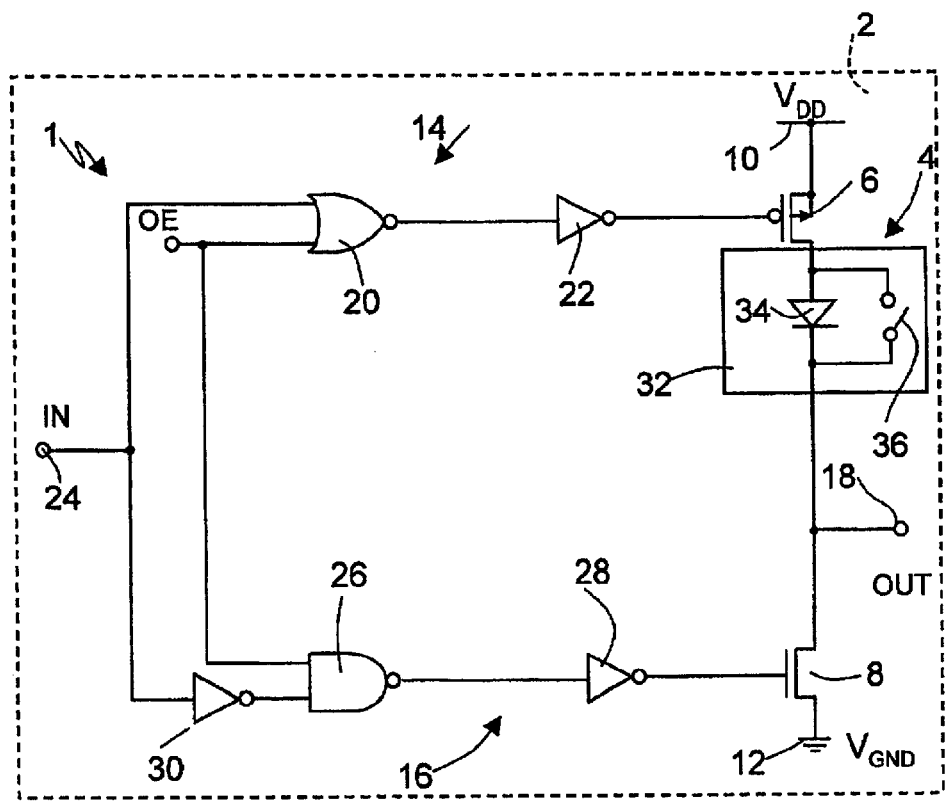
FIG. 1 shows a schematic circuit diagram of an output buffer according to the present invention.

FIG. 1 illustrates one of the possible implementations of the inventive principle underlying the present invention.

In particular, in FIG. 1 the reference number 1 designates, as a whole, an output buffer of a nonvolatile memory 2, which is schematically illustrated with a dashed line.

The output buffer 1 comprises an output stage 4 formed by a PMOS pull-up transistor 6 and an NMOS pull-down transistor 8, which are connected in series between a supply line 10 set at a supply voltage $V_{DD}$ and a ground line 12 set at a ground voltage $V_{GND}$, a driving stage 14 for driving the pull-up transistor, and a driving stage 16 for driving the pull-down transistor.

In particular, the pull-up transistor 6 has a source and a bulk terminals connected to the supply line 10, a drain terminal connected to the output 18 of the output buffer 1, and a gate terminal connected to the output of the respective driving stage 14, whilst the pull-down transistor 8 has a source terminal connected to the ground line 12, a drain terminal connected to the output 18 of the output buffer 1, and a gate terminal connected to the output of the respective driving stage 16.

The driving stage 14 of the pull-up transistor 6 basically comprises a NOR logic gate 20 and a logic inverter 22 which are cascaded together between the input 24 of the output buffer 1 and the gate terminal of the pull-up transistor 6.

In particular, the logic gate 20 has a first input receiving an enabling signal OE via which the user enables/disables the output buffer 1, a second input connected to the input 24 of the output buffer 1, and an output connected to an input of the logic inverter 22, the output of which is connected to the gate terminal of the pull-up transistor 6.

The driving stage 16 of the pull-down transistor 6 basically comprises a NAND logic gate 26 and a logic inverter 28, which are cascaded together between the input 24 of the output buffer 1 and the pull-down transistor 8.

In particular, the logic gate 26 has a first input receiving the enabling signal OE, a second input connected to the input 24 of the output buffer 1 via a logic inverter 30, and an output connected to an input of the logic inverter 28, the output of which is connected to the gate terminal of the pull-down transistor 8.

Finally, the output buffer 1 comprises a unidirectional decoupling stage 32 arranged between the drain terminal of the pull-up transistor 6 and the output 18 of the output buffer 1 to decouple the latter from the supply line 10 during the switching transient of the output buffer 1.

In particular, the unidirectional decoupling stage 32 is essentially formed by a unidirectional decoupling element 34 arranged between the drain terminal of the pull-up transistor 6 and the output 18 of the output buffer 1, and a switch 36 connected in parallel to the unidirectional decoupling element 34 to short-circuit the latter at the end of the switching transient of the output buffer 1.

In greater detail, in FIG. 1 the unidirectional decoupling element 34 is illustrated schematically as a diode having an anode terminal connected to the drain terminal of the pull-up transistor 6 and a cathode terminal connected to the output 18 of the output buffer 1.

Figure 2:
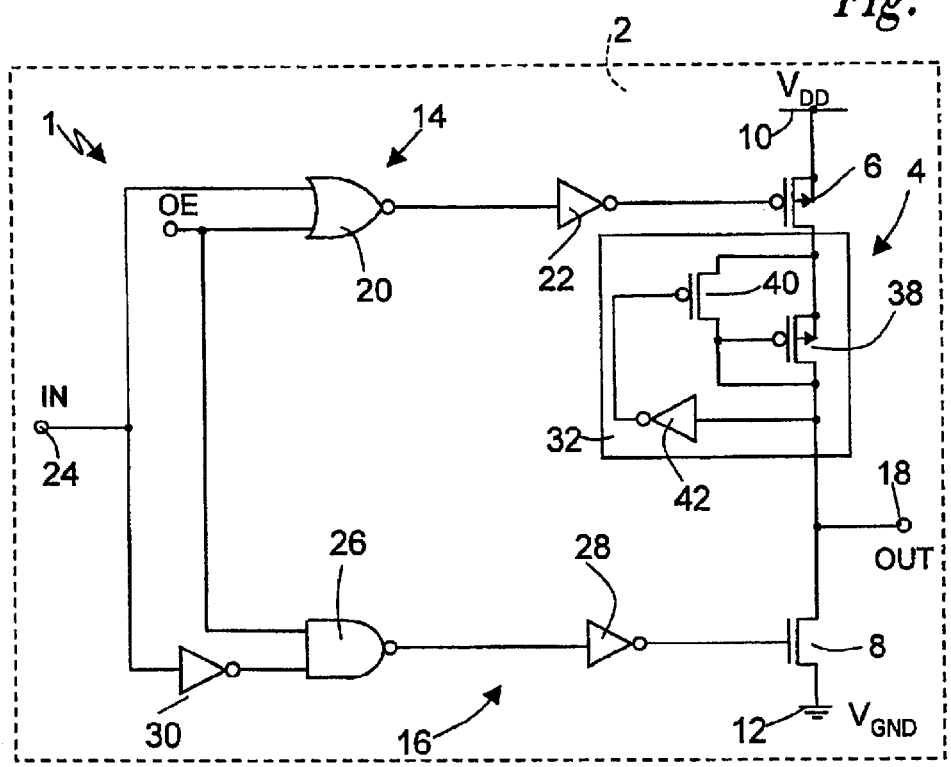
FIG. 2 shows the circuit diagram of an embodiment of the output buffer of FIG. 1.

FIG. 2 illustrates an example of embodiment of the unidirectional decoupling element 34 and of the switch 36 of the unidirectional decoupling stage 32, in which parts that are identical to those of FIG. 1 are designated by the same reference numbers.

As shown in FIG. 2, the unidirectional decoupling element 34 and the switch 36 are obtained by means of a pair of PMOS transistors 38, 40 connected in parallel, and a feedback logic inverter 42. In particular, the PMOS transistor 38 is diode-connected and has source and bulk terminals connected to the drain terminal of the pull-up transistor 6, and a drain and a gate terminals connected to the output 18 of the output buffer 1.

The PMOS transistor 40 has a source terminal connected to the drain terminal of the pull-up transistor 6, a drain terminal connected to the output 18 of the output buffer 1, and a gate terminal connected to the output of the logic inverter 42, the input of which is connected to the output 18 of the output buffer 1.

Operation of the unidirectional decoupling stage 32 is the following.

Suppose that the output 18 of the output buffer 1 switches from a low logic level (output voltage $V_{OUT}$ equal to the ground voltage $V_{GND}$) to a high logic level (output voltage $V_{OUT}$ equal to the supply voltage $V_{DD}$).

When the output voltage $V_{OUT}$ of the output buffer 1 is zero or, in any case, as long has it has relatively low values, i.e., values lower than the switching threshold of the logic inverter 42, the output of the logic inverter 42 assumes a high logic level, and hence the PMOS transistor 40 is off and the PMOS transistor 38 operates as a diode, preventing the switching noise present on the supply line 10 from being transferred onto the output 18 of the output buffer 1.

When the output voltage $V_{OUT}$ of the output buffer 1 exceeds the switching threshold of the logic inverter 42 (which depends upon the characteristics of the logic inverter 42), the output of the logic inverter 42 switches to a low logic level, thus turning-on the PMOS transistor 40. The PMOS transistor 40 short-circuits the PMOS transistor 38 and enables the output voltage $V_{OUT}$ to reach, at the end of the transient, a value equal to that of the supply voltage $V_{DD}$.

Figure 3:
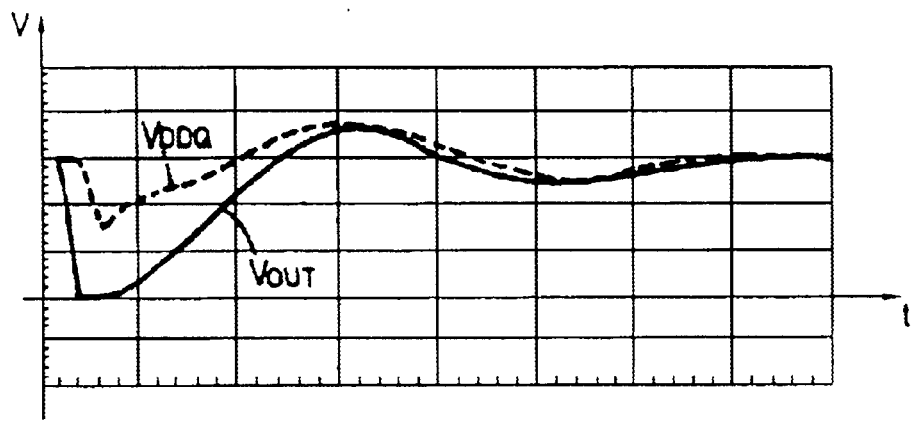
FIG. 3 shows the plots of the supply voltage and output voltage in an output buffer according to the prior art.
Figure 4:
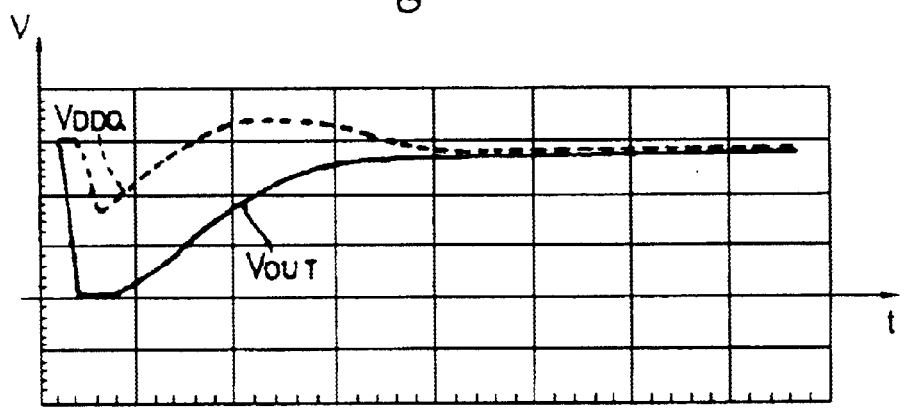
FIG. 4 shows the plots of the supply voltage and output voltage in the output buffer of FIG. 1.

FIGS. 3 and 4 respectively show the plots of the supply voltage $V_{DD}$ and output voltage $V_{OUT}$ in an output buffer according to the prior art, which is not provided with the unidirectional decoupling stage 32, and in the output buffer 1 according to the present invention, which is provided with the unidirectional decoupling stage 32.

In particular, from a comparative analysis of FIGS. 3 and 4 it is immediately evident how in an output buffer according to the prior art, which is not provided with the unidirectional decoupling stage 32, the output voltage $V_{OUT}$ follows the oscillations of the supply voltage $V_{DD}$, whereas in the output buffer 1 according to the present invention, which is provided with the unidirectional decoupling stage 32, the output voltage $V_{OUT}$ no longer follows the oscillations present on the supply voltage $V_{DD}$.

From the comparative analysis of FIGS. 3 and 4 it moreover emerges immediately evident how the output dynamics of the output buffer 1 is not reduced in any way by the presence of the unidirectional decoupling stage 32 and how the introduction of the unidirectional decoupling stage 32 leads to a damping of the oscillations present on the supply voltage $V_{DD}$.

Figure 5:
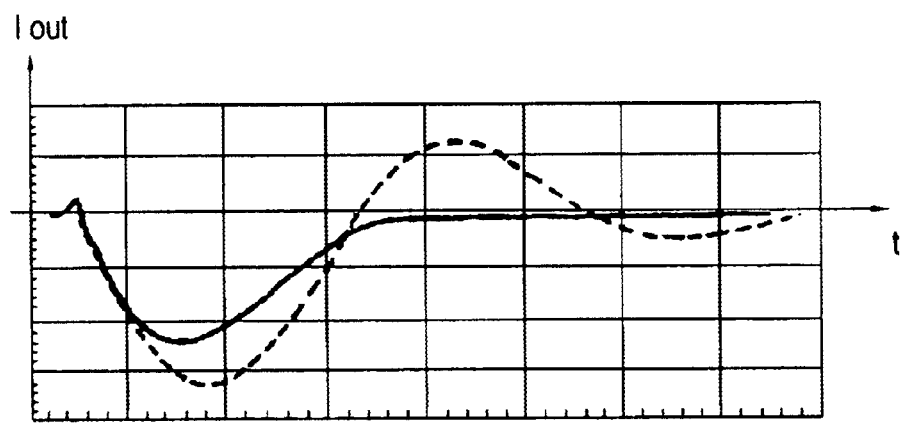
FIG. 5 shows the plots of the output current in an output buffer according to the prior art and in the output buffer of FIG. 1.

FIG. 5 shows, instead, the plot of the output current $I_{OUT}$ in an output buffer according to the prior art not provided with the unidirectional decoupling stage 32 (dashed line), and the plot of the output current $I_{OUT}$ in the buffer 1 according to the present invention provided with the unidirectional decoupling stage 32 (solid line).

From an analysis of FIG. 5 it is immediately evident how, in an output buffer according to the prior art not provided with the unidirectional decoupling stage 32, the output current $I_{OUT}$ presents wide oscillations generated by the oscillations of the supply voltage $V_{DD}$, whereas the presence of the unidirectional decoupling stage 32 inhibits the oscillations of the output current $I_{OUT}$.

Figure 6:
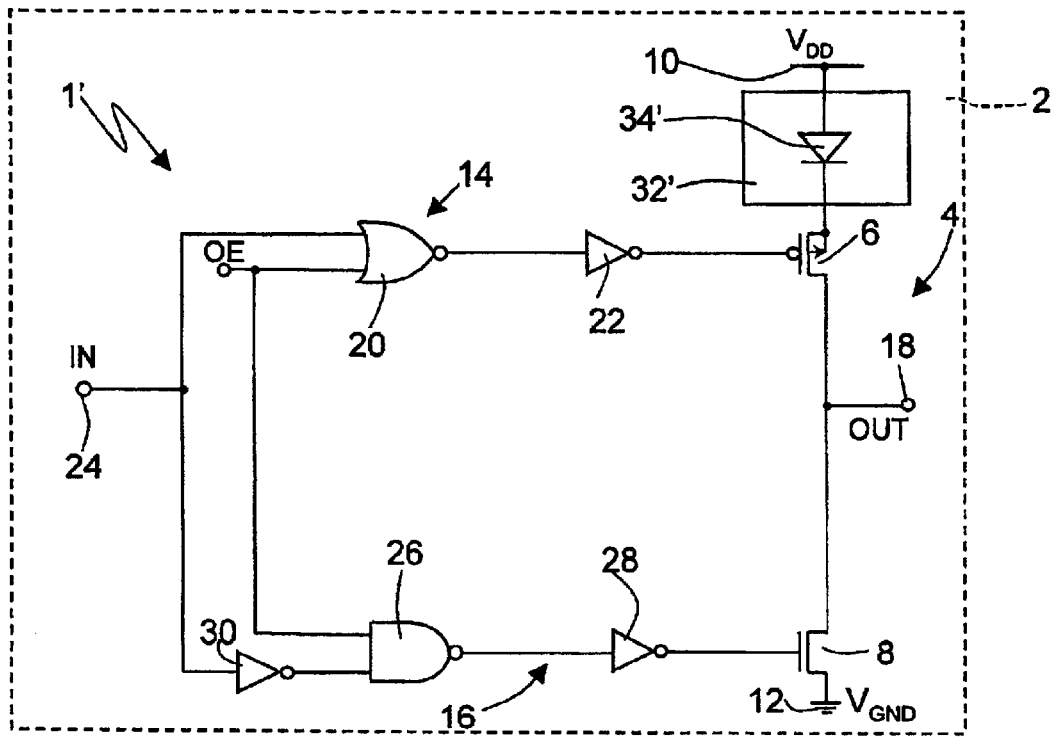
FIG. 6 shows a different schematic circuit diagram of an output buffer according to the present invention.

FIG. 6 illustrates another possible implementation of the inventive principle underlying the present invention, in which parts that are identical to those of FIG. 1 are designated by the same reference numbers.

In particular, the output buffer shown in FIG. 6, here designated by 1', differs from the output buffer 1 of FIG. 1 only in that the unidirectional decoupling stage, here designated by 32', is arranged between the supply line 10 and the source terminal of the pull-up transistor 6, and is formed only by a unidirectional decoupling element, here designated by 34'.

Figure 7:
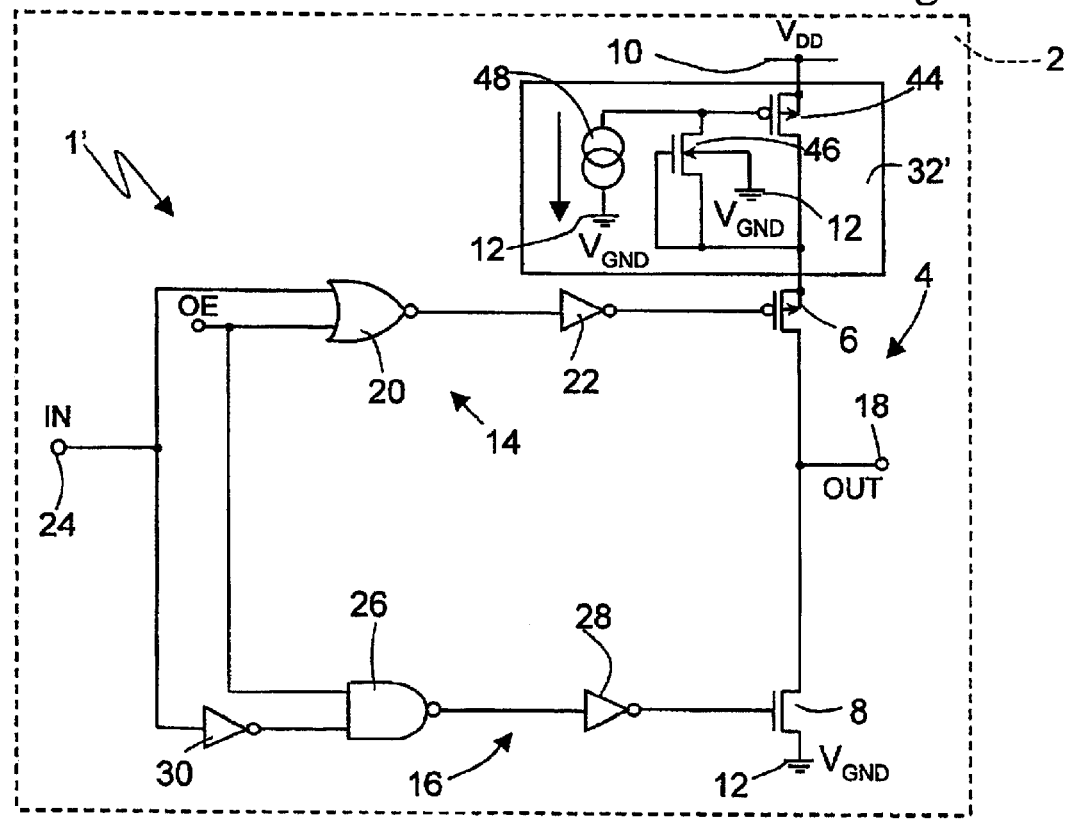
FIG. 7 shows the circuit diagram of an embodiment of the output buffer of FIG. 6.

FIG. 7 shows a possible embodiment of the unidirectional decoupling element 34', in which parts identical to those of FIG. 1 are designated by the same reference numbers.

In particular, as shown in FIG. 7, the unidirectional decoupling element 34' essentially consists of a so-called "threshold-lowering diode", namely a diode formed by a first transistor which has a diode-connection and which is modified by inserting, in the feedback path, a second transistor, which is also diode-connected and is biased by means of a current generator. In this way, then, the first transistor and the second transistor are equivalent to a transistor having a threshold voltage equal to the difference between the threshold voltages of the first transistor and second transistor.

For a more detailed treatment of threshold-lowering diodes, see, for example, the European patent application EP-A-1071211 in the name of the present applicant.

In the example illustrated in FIG. 7, the threshold-lowering diode is formed by a PMOS transistor 44, an NMOS transistor 46, and a current generator 48. The PMOS transistor 44 has a source and a bulk terminals connected to the supply line 10, a drain terminal connected to the source terminal of the pull-up transistor, and a gate terminal connected to the current generator 48, which is in turn connected to the ground line 12.

The NMOS transistor 46 is diode-connected and has a source terminal connected to the gate terminal of the PMOS transistor 44, a drain and gate terminals connected to the drain terminal of the PMOS transistor 44, and a bulk terminal connected to the ground line 12.

Operation of a threshold-lowering diode is known and consequently will not be described in detail herein.

It is only emphasized that, since a threshold-lowering diode has a relatively low equivalent threshold voltage, limitation of the output dynamics of the output buffer 1' resulting from its introduction is substantially negligible, and consequently the threshold-lowering diode does not have to be short-circuited at the end of the switching transient of the output buffer 1'; as a result, in this embodiment the switch 36 of FIG. 1 is no longer necessary.

The only precaution to be adopted in the embodiment illustrated in FIG. 7 is to see, by means of an appropriate control stage, to turning off the current generator 48 at the end of the switching transient or when the output buffer 1' is disabled or set in a stand-by condition, in order to prevent unnecessary static current consumption.

Figure 8:
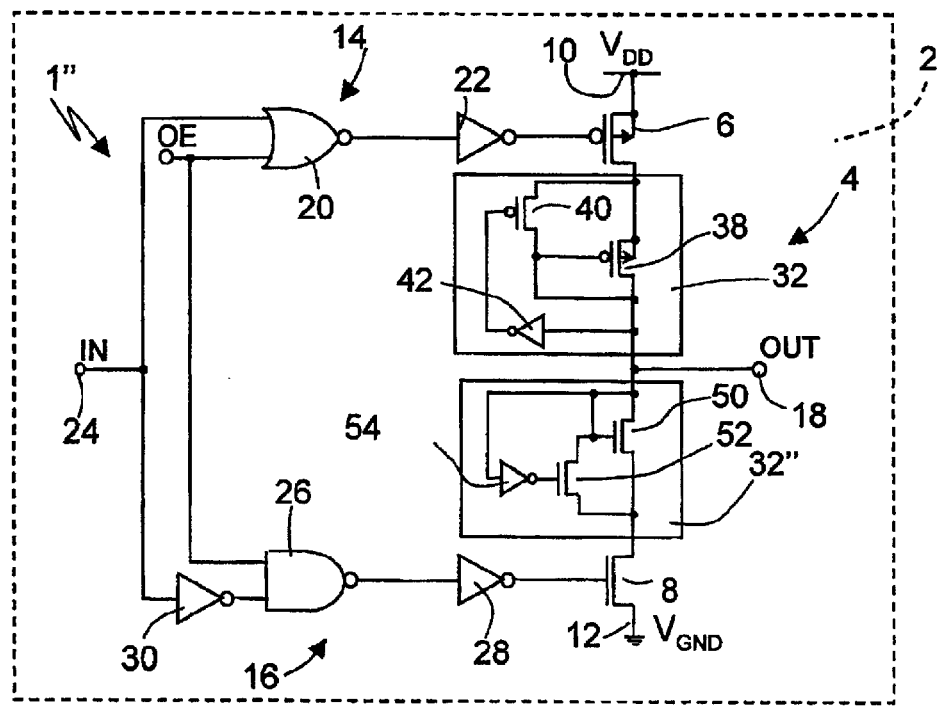
FIG. 8 shows a different embodiment of an output buffer according to the present invention.
Figure 9:
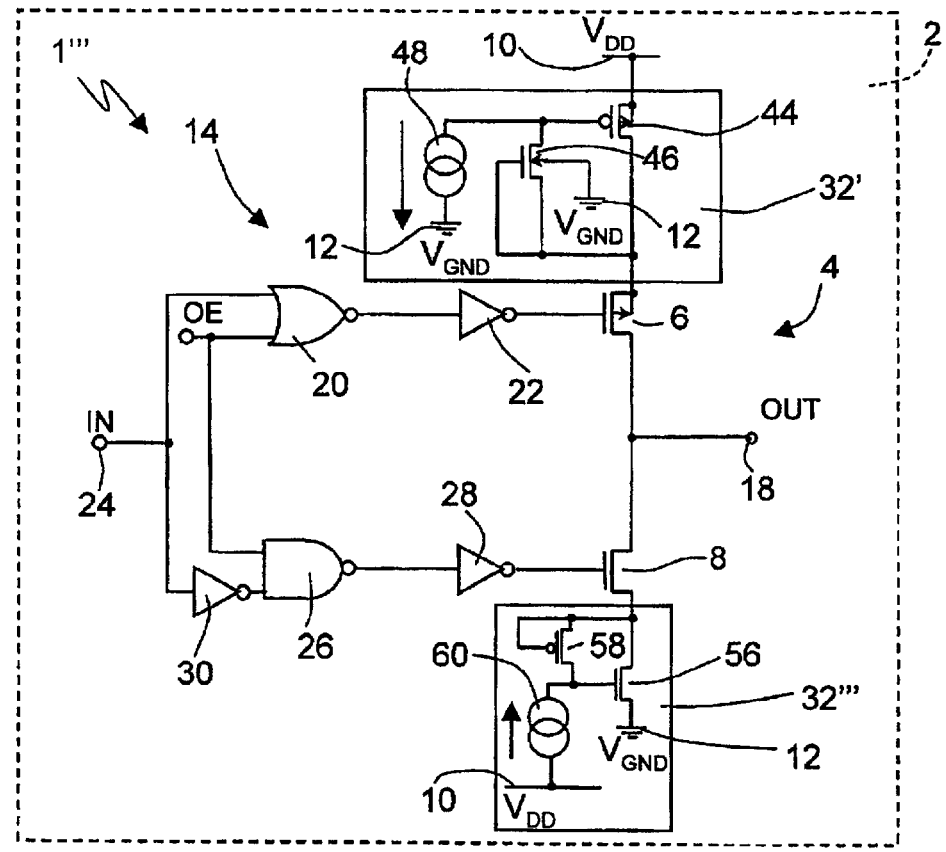
FIG. 9 shows a further embodiment of an output buffer according to the present invention.

FIGS. 8 and 9 illustrate two further possible embodiments of the present invention, in which parts identical to those of FIG. 1 are designated by the same reference numbers.

The output buffer shown in FIG. 8, designated by 1", differs from the output buffer 1 of FIG. 2 in that it comprises a further unidirectional decoupling stage, designated by 32", which is arranged between the output of the output buffer 1" and the drain terminal of the pull-down transistor 8, in such a way as to prevent the switching noise present on the ground line 12 from being transferred onto the output 18 of the output buffer 1".

In particular, the unidirectional decoupling stage 32" has a circuit structure similar to that of the unidirectional decoupling stage 32 of FIG. 2 and differs from the latter in that it is formed by transistors having a type of conductivity which is opposite to that of the transistors of the unidirectional decoupling stage 32 of FIG. 2.

In detail, the unidirectional decoupling stage 32" comprises a pair of NMOS transistors 50, 52 and a feedback logic inverter 54. The NMOS transistor 50 is diode-connected and has a gate and a drain terminals connected to the output 18 of the output buffer 1", and a source terminal connected to the drain terminal of the pull-down transistor 8, whilst the NMOS transistor 52 is connected in parallel to the NMOS transistor 50 and has a source terminal connected to the drain terminal of the pull-down transistor 8, a drain terminal connected to the output 18 of the output buffer 1", and a gate terminal connected to the output of the logic inverter 54, the input of which is connected to the output 18 of the output buffer 1".

The output buffer shown in FIG. 9, here designated by 1''', instead, differs from the output buffer 1' of FIG. 7 in that it comprises a further unidirectional decoupling stage, designated by 32''', which is arranged between the source terminal of the pull-down transistor 8 and the ground line 12, so as to prevent the switching noise present on the ground line from being transferred onto the output of the output buffer.

In particular, the unidirectional decoupling stage 32''' of FIG. 9 presents a circuit structure similar to that of the unidirectional decoupling stage 32' of FIG. 7 and differs from the latter in that it is formed by transistors having a type of conductivity which is opposite to that of the transistors of the unidirectional decoupling stage 32' of FIG. 7.

In detail, the unidirectional decoupling stage 32''' essentially consists of a threshold-lowering diode formed by an NMOS transistor 56, a PMOS transistor 58, and a current generator 60. The NMOS transistor 56 has a drain terminal connected to the source terminal of the pull-down transistor 8, a source terminal connected to the ground line 12, and a gate terminal connected to the current generator 60, which is in turn connected to the supply line 10.

The PMOS transistor 58 is diode-connected and has a source terminal connected to the gate terminal of the NMOS transistor 56, and a drain and gate terminals connected to the output 18 of the output buffer 1'''.

The advantages that the present invention makes possible emerge clearly from an examination of its characteristics.

In particular, decoupling of the output of the output buffer from power supply during switching of the output buffer itself, which is obtained by inserting an electronic component with characteristics of unidirectionality in series to the pull-up and pull-down transistors of the output stage of the output buffer, constitutes a simple and inexpensive way for preventing the switching noise present on the supply line from being transferred onto the output buffer, without worsening the switching times of the output buffer.

Furthermore, short-circuiting the unidirectional electronic component at the end of the switching transient of the output buffer prevents the switching transient from limiting the output dynamics of the output buffer.

Finally, it is clear that modifications and variations may be made to the output buffers described and illustrated herein, without thereby departing from the sphere of protection of the present invention as defined in the attached claims.

For example, the output buffer could even be provided with a single unidirectional decoupling stage for decoupling its own output from the ground line alone, and this decoupling stage could be arranged either between the output of the output buffer and the drain terminal of the pull-down transistor or between the source terminal of the latter and the ground line.

Furthermore, decoupling of the output of the output buffer both from the supply line and from the ground line may also be achieved by means of combinations of the unidirectional decoupling stages 32, 32', 32'' and 32''' different from the ones shown in FIGS. 8 and 9, i.e., using a unidirectional decoupling stage arranged between the pull-up transistor 6 and the output 18 of the output buffer and a unidirectional decoupling stage arranged between the pull-down transistor 8 and the ground line 12, or else using a unidirectional decoupling stage set between pull-up transistor 6 and the supply line 10 and a unidirectional decoupling stage set between the output 18 of the output buffer and the pull-down transistor 8.

In addition, each of the two threshold-lowering diodes previously described may also be formed by a pair of transistors which have the same type of conductivity and are connected in the way indicated in the aforementioned European patent application.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An output buffer for a memory device, comprising an output stage, including:
    a first transistor and a second transistor connected in series between a first line set at a first potential and a second line set at a second potential and having an intermediate node connected to an output of said output buffer; and
    means for unidirectionally decoupling the output of said output buffer from at least one of said first line and said second line during a switching transient of the output buffer, the decoupling means arranged in series with said first and second transistors between said first and second lines.

2. The output buffer according to claim 1, wherein said unidirectional decoupling means comprises at least a unidirectional decoupling stage arranged between said first transistor and the output of said output buffer.

3. The output buffer according to claim 2, wherein said unidirectional decoupling stage comprises a third transistor and a fourth transistor and inverter means, said third transistor being diode-connected and being arranged between the output of said output buffer and said first transistor, said fourth transistor being connected in parallel to said third transistor, and said inverter means having an input connected to the output of said output buffer, and an output connected to a control terminal of said fourth transistor.

4. The output buffer according to claim 1 wherein said unidirectional decoupling means comprises two unidirectional decoupling stages arranged between the output of said output buffer and, respectively, said first and second transistors.

5. The output buffer according to claim 1, wherein said unidirectional decoupling means comprises at least one unidirectional decoupling stage arranged between said first line and said first transistor.

6. The output buffer according to claim 5, wherein said unidirectional decoupling stage comprises a threshold-lowering diode.

7. The output buffer according to claim 6, wherein said threshold-lowering diode comprises a fifth transistor having a first terminal and a second terminal respectively connected to said first line and to said first transistor; a sixth transistor diode-connected and arranged between said first transistor and a control terminal of said fifth transistor; and current-generating means connected to said control terminal of said fifth transistor.

8. The output buffer according claim 6, wherein said unidirectional decoupling means comprise two unidirectional decoupling stages arranged between said first line and said first transistor and, respectively, between said second line and said second transistor.

9. The output buffer according to claim 1 wherein said first line is a supply line set at a supply potential, and said second line is a ground line set at a ground potential.

10. The output buffer according to claim 1 wherein said first line is a ground line set at a ground potential, and said second line is a supply line set at a supply potential.

11. The output buffer according to claim 1 wherein said first transistor is a pull-up transistor, and in that said second transistor is a pull-down transistor.

12. The output buffer according to claim 1 wherein said first transistor is a pull-down transistor, and in that said second transistor is a pull-up transistor.

13. A memory device, comprising:
   an output buffer, that includes:
      a first line set at a first potential and a second line set at a second potential;
      a first transistor and a second transistor connected in series between the first line and the second line, and having an intermediate node connected to an output of said output buffer; and
      means for unidirectionally decoupling the output of said output buffer from one of said first and second lines during a switching transient of the output buffer, the decoupling means arranged in series with said first and second transistors between said first and second lines.

14. A method, comprising:
   inputting a first logic value to an input of an output buffer;
   inputting a second logic value, different from the first value, to the input; and
   unidirectionally decoupling an output of the output buffer from a line at a first potential during a switching transient of the output buffer.

15. The method of claim 14 wherein the decoupling step includes the step of coupling a diode between a line at a first potential and the output of the output buffer.

16. The method of claim 15, further comprising short circuiting the diode when, during a transition from the first logic value to the second logic value, a potential at the output crosses a selected threshold voltage.

17. The method of claim 15 wherein the diode is a diode connected transistor.

18. A device, comprising:
   a first line at a first potential;
   a second line at a second potential;
   first and second switches coupled in series between the first and second lines, and defining, between the first and second switches, an output node;
   a diode coupled between the output node and the first line; and
   a third switch coupled in parallel to the diode, the third switch configured to close at an end of a switching transient of the device.

19. The device of claim 18 wherein the diode is coupled between the output node and the first switch.

20. The device of claim 18 wherein the diode is a first diode, and further comprising a second diode, coupled between the output node and the second line.

21. A device, comprising:
   a first line at a first potential;
   a second line at a second potential;
   first and second switches coupled in series between the first and second lines, and defining, between the first and second switches, an output node; and
   a threshold lowering diode coupled in series between the first line and the output node, the threshold lowering diode having a first transistor coupled between first and second terminals of the threshold lowering diode, a second transistor in diode configuration coupled between the second terminal and a control terminal of the first transistor, and a current generator having an output coupled to the control terminal of the first transistor.

22. The device of claim 21, further comprising an additional threshold lowering diode coupled in series between the second line and the output node.

* * * * *

UNITED STATES PATENT AND TRADEMARK OFFICE
CERTIFICATE OF CORRECTION

PATENT NO. : 6,788,586 B2
DATED : September 7, 2004
INVENTOR(S) : Emanuele Confalonieri et al.

It is certified that error appears in the above-identified patent and that said Letters Patent is hereby corrected as shown below:

Column 8,
Line 54, "according to claim 6," should read as -- according to Claim 1 --.

Signed and Sealed this

Twenty-third Day of August, 2005

JON W. DUDAS
*Director of the United States Patent and Trademark Office*